(12) United States Patent
Lim et al.

(10) Patent No.: US 11,166,398 B2
(45) Date of Patent: Nov. 2, 2021

(54) FUNCTIONAL CONTACTOR

(71) Applicant: AMOTECH CO., LTD., Incheon (KR)

(72) Inventors: Byung Guk Lim, Incheon (KR); Jae Woo Choi, Suwon-si (KR)

(73) Assignee: AMOTECH CO., LTD., Incheon (KR)

(*) Notice: Subject to any disclaimer, the term of this patent is extended or adjusted under 35 U.S.C. 154(b) by 213 days.

(21) Appl. No.: 16/347,779

(22) PCT Filed: Nov. 6, 2017

(86) PCT No.: PCT/KR2017/012456
§ 371 (c)(1),
(2) Date: May 6, 2019

(87) PCT Pub. No.: WO2018/088762
PCT Pub. Date: May 17, 2018

(65) Prior Publication Data
US 2019/0320561 A1    Oct. 17, 2019

(30) Foreign Application Priority Data

Nov. 9, 2016  (KR) .......................... 10-2016-0148652

(51) Int. Cl.
*H05K 9/00* (2006.01)
*H01L 49/02* (2006.01)
(Continued)

(52) U.S. Cl.
CPC ........... *H05K 9/0067* (2013.01); *H01L 28/60* (2013.01); *H01R 13/24* (2013.01); *H05K 1/0259* (2013.01);
(Continued)

(58) Field of Classification Search
CPC .. H05K 9/0067; H05K 9/0079; H05K 1/0259; H05K 9/00; H01R 13/24;
(Continued)

(56) References Cited

U.S. PATENT DOCUMENTS 6,538,197 B1   3/2003  Kawai
7,048,549 B1 * 5/2006  Swain ................ H01R 13/2435
                                                          439/591

(Continued)

FOREIGN PATENT DOCUMENTS

KR  2005-0028748    3/2005
KR  2007-0109332   11/2007
(Continued)

OTHER PUBLICATIONS

International Search Report and Written Opinion issued in International Patent Application No. PCT/KR2017/012303, dated Mar. 6, 2018.

(Continued)

*Primary Examiner* — Danny Nguyen
(74) *Attorney, Agent, or Firm* — Norton Rose Fulbright US LLP

(57) ABSTRACT

A functional contactor is provided. A functional contactor according to an exemplary embodiment of the present invention comprises; a clip-shaped conductor having elasticity which is in electrical contact with a conductor of an electronic device; a functional element which is electrically connected to the clip-shaped conductor in series via a solder and comprises a first electrode and a second electrode respectively provided on the entire upper and lower surfaces thereof; and an arrangement guide which is formed to surround at least a part of the clip-shaped conductor on the upper surface of the functional element so as to arrange the position of the clip-shaped conductor and is made of non-conductive resin.

12 Claims, 6 Drawing Sheets

(51) Int. Cl.
    *H01R 13/24* (2006.01)
    *H05K 1/02* (2006.01)
    *H01G 4/40* (2006.01)
(52) U.S. Cl.
    CPC .............. *H05K 9/0079* (2013.01); *H01G 4/40* (2013.01); *H01L 49/02* (2013.01); *H05K 9/00* (2013.01)
(58) Field of Classification Search
    CPC ....... H01R 13/703; H01L 49/02; H01L 28/60; H01C 7/10; H01G 4/40
    USPC .................................................. 361/212, 220
    See application file for complete search history.

(56) References Cited

U.S. PATENT DOCUMENTS

| | | | | |
|---|---|---|---|---|
| 2009/0179315 | A1* | 7/2009 | Jereza | ..................... H01L 24/36 257/676 |
| 2010/0006625 | A1* | 1/2010 | Eom | .................. H05K 13/0465 228/164 |
| 2013/0122683 | A1 | 5/2013 | Malhotra et al. | |
| 2014/0240878 | A1 | 8/2014 | Otsubo | |
| 2015/0287666 | A1* | 10/2015 | Groenhuis | ........ H01L 23/49524 257/676 |
| 2019/0097363 | A1* | 3/2019 | Cho | ....................... H05K 1/181 |

FOREIGN PATENT DOCUMENTS

| | | |
|---|---|---|
| KR | 2008-0031183 | 4/2008 |
| KR | 2010-0011834 | 2/2010 |
| KR | 2010-0101225 | 9/2010 |
| KR | 2010-0139075 | 12/2010 |
| KR | 10-1334237 | 11/2013 |
| KR | 10-1585604 | 1/2016 |
| KR | 2016-0093563 | 8/2016 |

OTHER PUBLICATIONS

International Search Report and Written Opinion issued in International Patent Application No. PCT/KR2017/012302, dated Mar. 7, 2018.

International Search Report and Written Opinion issued in International Patent Application No. PCT/KR2017/012456, dated Mar. 22, 2018.

* cited by examiner

FUNCTIONAL CONTACTOR

CROSS-REFERENCE TO RELATED APPLICATIONS

This application is a national phase application under 35 U.S.C. § 371 of International Application No. PCT/KR2017/012456, filed Nov. 6, 2017, which claims priority to and the benefit of Korean Patent Application No. 10-2016-0148652, filed Nov. 9, 2016. The contents of the referenced patent application are incorporated into the present application by reference.

FIELD OF THE DISCLOSURE

The present invention relates to a contactor of an electronic device such as, e.g., a smart phone or the like.

DESCRIPTION OF RELATED ART

In a portable electronic device employing a housing or case of a metal material, a conductive contactor (or a conductive gasket) is installed between an external housing and an embedded circuit substrate of the portable electronic device so as to alleviate impact, block electromagnetic waves, and the like.

In this case, since an electrical path is formed between the external housing and the embedded circuit substrate due to the conductive contactor, static electricity having a high voltage may instantaneously flow through a conductor such as an external metal housing to flow into the embedded circuit substrate through the conductive contactor such that a circuit, such as an integrated circuit (IC) or the like, may be damaged. Further, when the portable electronic device is charged, a leakage current generated by an alternating current (AC) power source flows to the external housing along a ground of a circuit so that a user is uncomfortable, and, in the worst case, the leakage current results in electric shock which may cause injury to the user.

In addition, when the metal housing is used as an antenna, since a signal is attenuated when capacitance of the conductive contactor is low and thus a radio frequency (RF) signal is not transferred smoothly, the conductive contactor is required to implement high capacitance.

A functional element for protecting the user from the static electricity or the leakage current is provided together with the conductive gasket or contactor to connect the metal housing to a circuit substrate. As a conductor such as a metal case is employed, it is required for a functional contactor which has various functions not only for a simple electrical contact but also for protecting a user or a circuit in the portable electronic device or smoothly transferring a communication signal.

Further, in the functional contactor, when an area of an electrode is made to be large so as to increase a capacity of capacitance of the functional element, since printed solder is present in a liquid state in a process of stacking a conductive elastic portion such as a clip-shaped conductor having a relatively small size on an electrode through soldering or mounting the functional element having the conductive elastic portion, which is stacked through soldering, on a circuit substrate through secondary soldering, the conductive elastic portion is not fixed and a position thereof is varied such that a large amount of defects occur.

SUMMARY OF THE INVENTION

The present invention is directed to providing a functional contactor which is capable of aligning a conductive elastic portion in a precise position even when soldering is performed for bonding with a functional element or mounting a circuit substrate by providing an alignment function of the conductive elastic portion.

One aspect of the present invention provides a functional contactor including a clip-shaped conductor configured to come into electrical contact with a conductor of an electronic device and having elasticity, a functional element electrically connected in series to the clip-shaped conductor using solder and having a first electrode and a second electrode which are provided on entireties of an upper surface and a lower surface of the functional element, respectively, and an arrangement guide formed to surround at least a part of the clip-shaped conductor on the upper surface of the functional element so as to align a position of the clip-shaped conductor and made of a non-conductive resin.

The arrangement guide may not be formed in a region in which a bent portion having elasticity of the clip-shaped conductor is disposed.

The arrangement guide may be formed to have a thickness corresponding to 10 to 170% of a printed thickness of the solder.

The arrangement guide may be formed to be spaced a predetermined gap apart from the clip-shaped conductor.

The arrangement guide may be formed to be in contact with the clip-shaped conductor.

The arrangement guide may include at least a first portion and a second portion which are formed on two sides of the clip-shaped conductor in a width direction.

The arrangement guide may further include a third portion extending from at least one of the first portion and the second portion in a direction toward the remaining one thereof.

The arrangement guide may further include a third portion vertically connecting the first portion to the second portion.

The non-conductive resin may be formed of any one among overglass, epoxy, epoxy containing a filler, a polymer, and a non-conductive paste.

The non-conductive resin may be a low temperature curing resin which is cured at a temperature in a range of 140 to 210° C.

The non-conductive resin may be thermally decomposed at a temperature that is higher than a melting point of the solder.

The functional element may have at least one among an electric shock prevention function of blocking a leakage current of an external power source flowing from the ground of a circuit substrate of the electronic device, a communication signal transfer function of passing a communication signal flowed from a conductive case or the circuit substrate, and an electrostatic discharge (ESD) protection function of passing the ESD without a dielectric breakdown when the ESD flows from the conductive case.

In accordance with the present invention, since an arrangement guide made of a non-conductive resin is provided on a large-area electrode of a functional element, when a clip-shaped conductor is stacked on the functional element through soldering, the clip-shaped conductor can be aligned at a precise position such that it is possible to prevent a position of the clip-shaped conductor from being varied and prevent electrical or mechanical defects. Consequently, it is possible to stably bond the clip-shaped conductor, thereby improving accuracy and reliability of a product.

Further, in accordance with the present invention, since the arrangement guide is provided to surround at least a part of the clip-shaped conductor, when the clip-shaped conductor is bonded to the functional element through soldering or a functional contactor is mounted on a circuit substrate through soldering, the clip-shaped conductor is confined by a guide so that, even though a reflow process is performed once or twice, movement of the clip-shaped conductor due to molten liquid solder can be prevented. Consequently, without additional effort for an alignment, a soldering process can be performed stably and easily such that production efficiency can be improved.

DETAILED DESCRIPTION OF THE INVENTION

Figure 1:
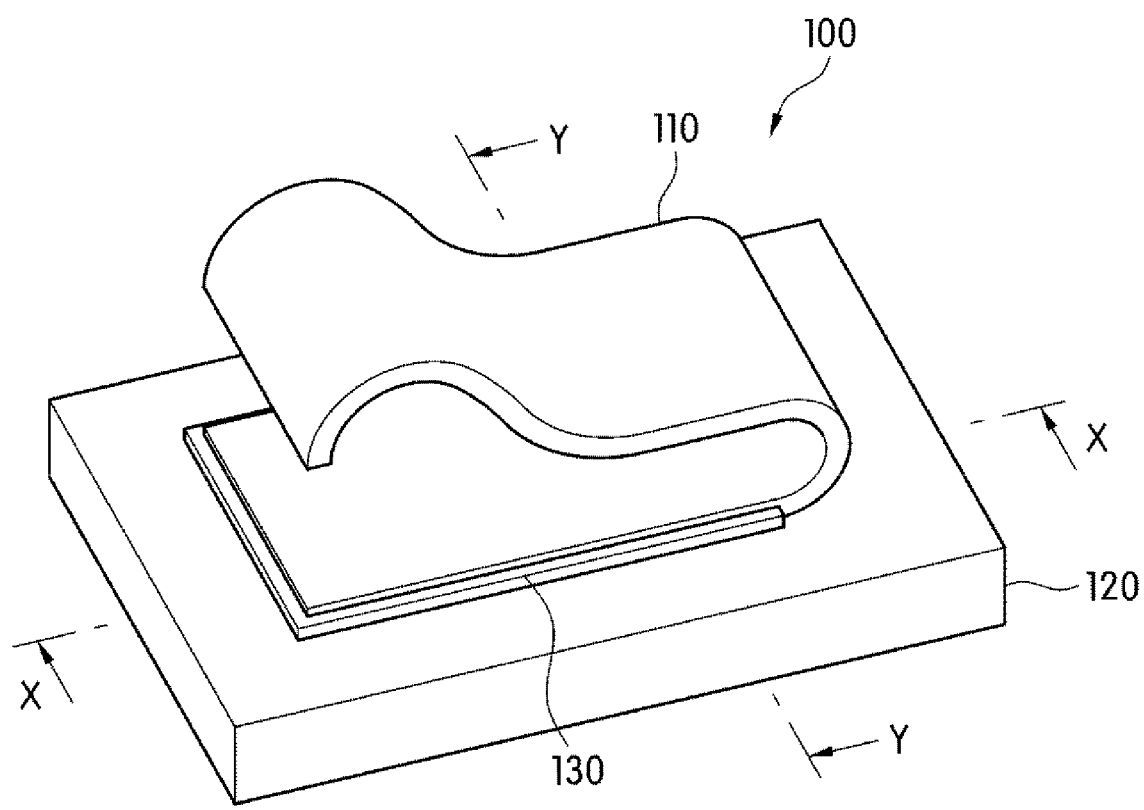
FIG. 1 is a perspective view illustrating a functional contactor according to one embodiment of the present invention.

Hereinafter, embodiments of the present invention will be fully described in detail which is suitable for easy implementation by those skilled in the art to which the present invention pertains with reference to the accompanying drawings. The present invention may be implemented in various different forms, and thus it is not limited to embodiments which will be described herein. In the drawings, some portions not related to the description will be omitted in order to clearly describe the present invention, and the same or similar reference numerals are given to the same or similar components throughout this disclosure.

Figure 2:
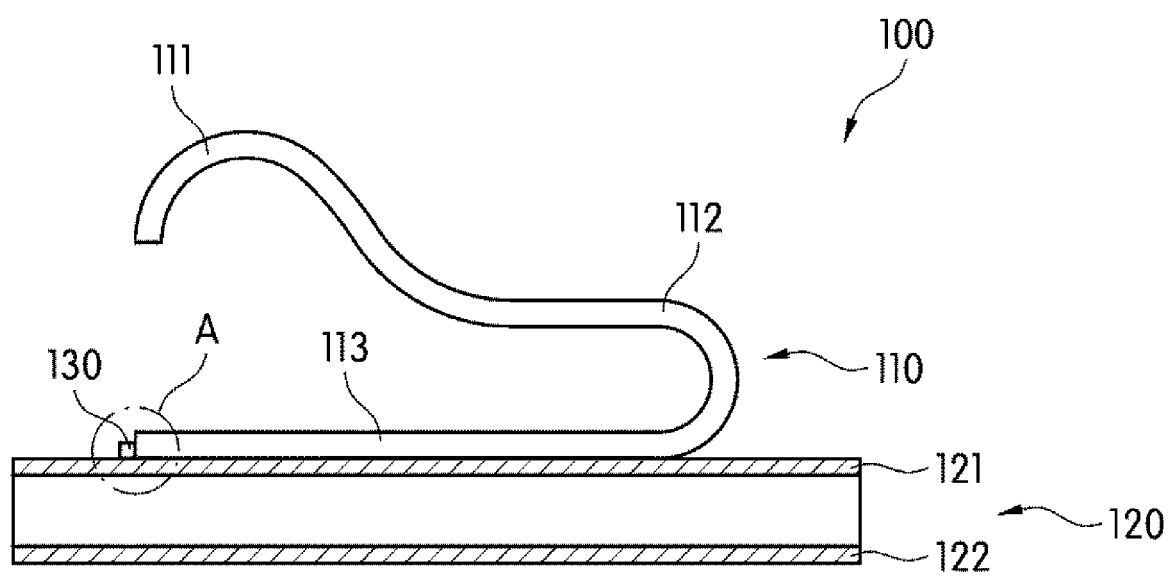
FIG. 2 is a cross-sectional view taken along line X of FIG. 1.

As shown in FIGS. 1 and 2, a functional contactor 100 according to one embodiment of the present invention includes a clip-shaped conductor 110, a functional element 120, and an arrangement guide 130.

In a portable electronic device, the functional contactor 100 is configured to electrically connect a conductive case such as an external metal case to a circuit substrate or to electrically connect the conductive case to a conductive bracket electrically coupled to the circuit substrate.

That is, in the functional contactor 100, the clip-shaped conductor 110 may come into contact with the circuit substrate or the conductive bracket and the functional element 120 may be coupled to the conductive case. In contrast, the conductive elastic portion 110 may come into contact with the conductive case, and the functional element 120 may be coupled to the circuit substrate.

For example, when the functional contactor 100 is a functional contactor of a surface mount technology (SMT) type, i.e., the functional contactor 100 is coupled through soldering, the functional element 120 may be bonded to the circuit substrate, and when the functional contactor 100 is a functional contactor of an adhesive layer type, i.e., the functional contactor 100 is coupled through a conductive adhesive layer, the functional element 120 may be coupled to the conductive case.

Meanwhile, the portable electronic device may be a portable terminal such as a smart phone, a cellular phone, or the like and may be a smart watch, a digital camera, a digital multimedia broadcasting (DMB), an electronic book, a netbook, a tablet personal computer (PC), or the like. The electronic device may have any suitable electronic components including antenna structures for communicating with external devices.

Here, the conductive case may serve as an antenna for communication between the portable electronic device and an external device. For example, the conductive case may be provided to partially or entirely surround a side portion of the portable electronic device.

The clip-shaped conductor 110 is in electrical contact with a conductor of the electronic device and has elasticity. For example, the conductive elastic portion 110 comes into electrical contact with any one among the circuit substrate of the electronic device, the bracket coupled to the circuit substrate, and a conductor, such as a case contactable with a human body.

Here, when the clip-shaped conductor 110 comes into contact with the conductor, the clip-shaped conductor 110 may be contracted to the functional element 120 due to a pressurizing force, and when the conductor is separated from the clip-shaped conductor 110, the clip-shaped conductor 110 may be restored to its original state due to elasticity.

Meanwhile, when the clip-shaped conductor 110 is pressurized, galvanic corrosion occurs due to a potential difference between dissimilar metals. In this case, in order to minimize galvanic corrosion, the clip-shaped conductor 110 may be formed to have a small contact area.

The clip-shaped conductor 110 may have one side coming into contact with the conductor and the other side electrically connected to the functional element 120 and may include a contact portion 111, a bent portion 112, and a terminal 113.

Here, the clip-shaped conductor may be a C-shaped clip which is substantially "C" shaped. Since the clip-shaped conductor 110 is in line contact or in point contact, galvanic corrosion may be suppressed or minimized.

The contact portion 111 may have a curved shape and may come into electrical contact with the conductor. The bent portion 112 may be formed to extend from the contact portion 111 in a round shape and may have elasticity. The terminal 113 may be formed to extend from the bent portion 112 below the contact portion 111 in a plate shape and may be a terminal electrically connected to the functional element 120.

The contact portion 111, the bent portion 112, and the terminal 113 may be integrally formed of a conductive material having elasticity.

The functional element 120 includes a first large-area electrode 121 and a second large-area electrode 122 which are electrically connected in series to the clip-shaped conductor 110 using the solder 101 and configured to increase a capacity of capacitance.

In order to realize a large-area electrode, the first electrode 121 is formed on an entirety of an upper surface of the functional element 120. That is, the first electrode 121 may be integrally provided on the entirety of the upper surface of the functional element 120.

The first electrode 121 is stacked on and coupled to the clip-shaped conductor 110 using solder. That is, the first electrode 121 may be stacked on the clip-shaped conductor 110 through an SMT soldering process.

In order to realize a large-area electrode, the second electrode 122 is formed on an entirety of a lower surface of the functional element 120. That is, the second electrode 122 may be integrally provided on the entirety of the lower surface of the functional element 120.

The second electrode 122 may be bonded to the circuit substrate through soldering or to a conductor such as a conductive case through a conductive adhesive layer.

Here, the functional element 120 may have a function of protecting a user or an internal circuit. For example, the functional element 120 may include at least one among an electric shock protection element, a varistor, a suppressor, a diode, and a capacitor.

That is, the functional element 120 may block a leakage current of an external power source flowing into the conductor from a ground of the circuit substrate. In this case, the functional element 120 may be configured to have a breakdown voltage Vbr or a withstanding voltage that is higher than a rated voltage of the external power source of the electronic device. Here, the rated voltage may be a standard rated voltage for each country. For example, the rated voltage may be any one among 240 V, 110 V, 220 V, 120 V, and 100 V.

Further, when the conductive case has a function of an antenna, the first electrode 121 and the second electrode 122 respectively provided on the upper surface and the lower surface of the functional element 120 may serve as a capacitor to block the leakage current of the external power source as well as to pass a communication signal flowed from the conductor or the circuit substrate.

Further, the functional element 120 may pass an electrostatic discharge (ESD) flowing from the conductive case without a dielectric breakdown. In this case, the functional element 120 may be configured to have a breakdown voltage Vbr that is lower than a dielectric breakdown voltage Vcp of a sintered body provided between the first electrode 121 and the second electrode 122.

Accordingly, the functional contactor 100 may electrically connect the conductive case to the circuit substrate to allow the communication signal, the ESD, and the like to be passed, but the functional contactor 100 may block the leakage current of the external power source from the circuit substrate from flowing to the conductive case.

The arrangement guide 130 is formed to surround at least a part of the clip-shaped conductor 110 on the upper surface of the functional element 120 so as to align a position of the clip-shaped conductor 110 and is made of a non-conductive resin.

Figure 3:
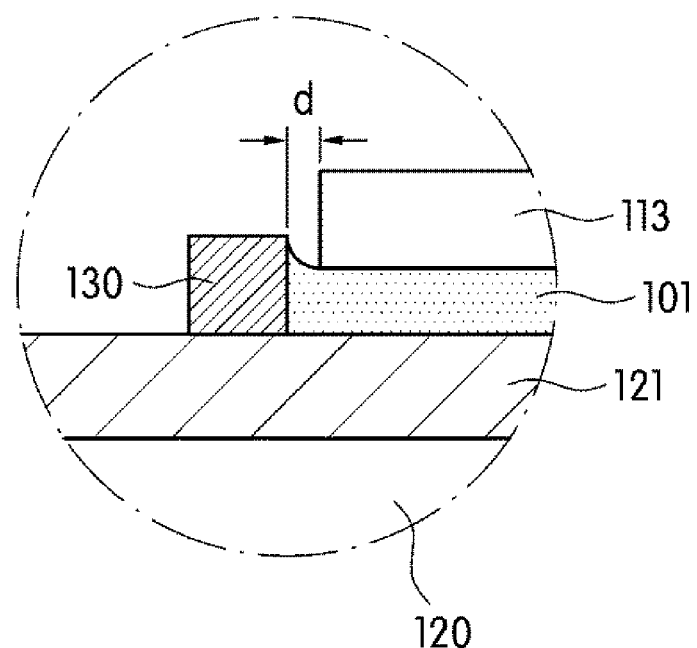
FIG. 3 is an enlarged view of a portion A of FIG. 2.

As shown in FIG. 3, the arrangement guide 130 may be formed to be spaced a predetermined gap d apart from the clip-shaped conductor 110. Thus, a degree of freedom in precision of a process of forming the arrangement guide 130 may be improved. That is, even when the arrangement guide 130 is formed using a process with low precision, confinement of the clip-shaped conductor 110 by the arrangement guide 130 may be achieved. In this case, the gap d should be formed to be a size that is smaller than a position alignment error of the clip-shaped conductor 110.

Alternatively, the arrangement guide 130 may be formed to be in contact with the clip-shaped conductor 110. That is, when the process of forming the arrangement guide 130 is adjustable to a minute error and thus precision of the process is high, the clip-shaped conductor 110 and the arrangement guide 130 may be formed to substantially be in contact with each other to improve position precision of the clip-shaped conductor 110.

Figure 4:
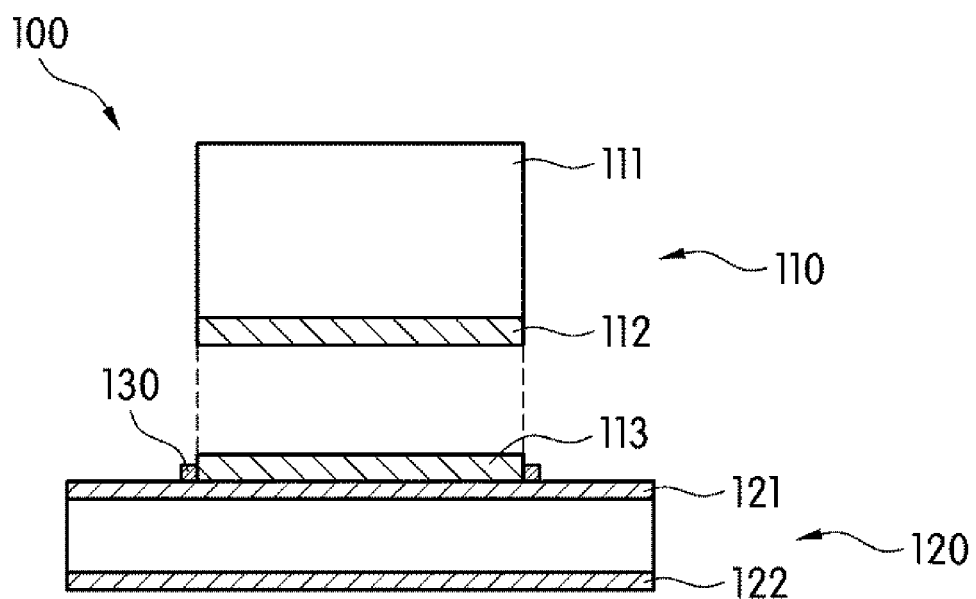
FIG. 4 is a cross-sectional view taken along line Y of FIG. 1.

As shown in FIG. 4, the arrangement guide 130 may be formed to have a predetermined thickness so as to confine the solder 101. For example, the arrangement guide 130 may be formed to have a printed thickness of the solder 101, e.g., 10 to 170% of a thickness of a solder paste 101'.

In other words, during the SMT process, the arrangement guide 130 has a function of aligning the position of the clip-shaped conductor 110. However, in this case, since a function of partially confining the solder of a molten state should be added to the arrangement guide 130, a thickness h1 of the arrangement guide 130 may be formed to be larger than a thickness h2 of the solder paste 101' (see FIG. 10).

Thus, in the molten state, the solder 101 may be confined inside the arrangement guide 130 without flowing over the arrangement guide 130. In this case, the solder 101 may be formed to be in a state of being slightly lower than the thickness of the arrangement guide 130 (see FIG. 11).

Figure 12:
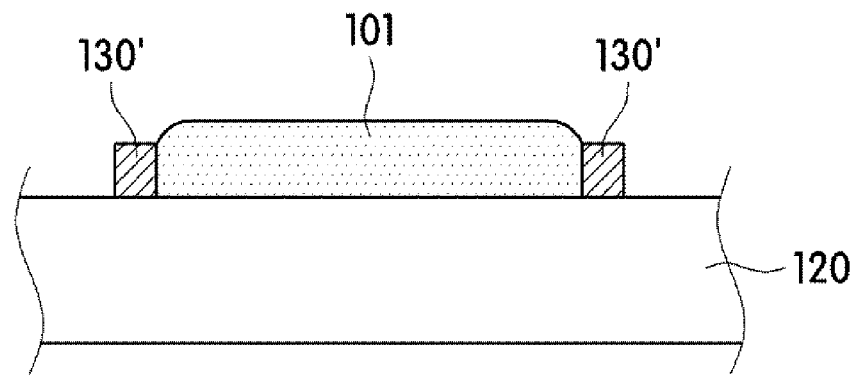
FIG. 12 is a cross-sectional view of another example taken along line Z of FIG. 9.

Alternatively, an arrangement guide 130' may be formed to have a thickness h3 that is smaller than the thickness h2 of the solder paste 101' (see FIG. 12).

Thus, in the molten state, the solder 101 may be confined inside the arrangement guide 130' due to surface tension without flowing over the arrangement guide 130'. In this case, the solder 101 may be formed to be in a state of being slightly higher than the thickness of the arrangement guide 130' (see FIG. 13).

Here, preferably, the arrangement guide 130 or 130' may be formed to have a thickness in a range of 5 to 20 μm, the solder paste 101' may be formed to have a thickness in a range of 40 to 80 μm, and the solder 101 after the completion of soldering may be formed to have a thickness in a range of 20 to 40 μm.

When the arrangement guide 130 surrounds at least a part of a perimeter of the clip-shaped conductor 110 and when the clip-shaped conductor is stacked on and soldered to the functional element through soldering, not only may the clip-shaped conductor be aligned at a correct position but also movement of the clip-shaped conductor 110 may be confined by the arrangement guide 130 such that it is possible to prevent a misalignment of the clip-shaped conductor 110 by molten liquid solder, thereby preventing an electrical or mechanical defect from occurring during the SMT soldering process.

Further, since the clip-shaped conductor 110 is not aligned at the correct position on the first electrode 121 of the functional element 120 due to a pick-up error during the process, the clip-shaped conductor 110 is displaced from the correct position such that a misalignment of the clip-shaped conductor 110 occurs, and a case in which a load is concentrated on a misaligned portion to cause a crack of the functional element 120 occurs frequently. To solve the above-described problem, an alignment technique is a core element. According to embodiments of the present invention, the clip-shaped conductor 110 is confined by the arrangement guide 130 to prevent the misalignment of the clip-shaped conductor 110 such that the clip-shaped conductor 110 may be stably coupled to the functional element 120. Consequently, precision and reliability of a product may be improved.

Further, when the clip-shaped conductor 110 is confined by the arrangement guide 130 and thus the functional contactor 100 is coupled to the circuit substrate or the like through soldering, i.e., even though the solder between the clip-shaped conductor 110 and the functional element 120 is melted and thus a state of the solder changes to a liquid phase even during a reflow process which is performed twice, movement of the clip-shaped conductor 110 is confined by the arrangement guide 130 such that it is possible to prevent the movement of the clip-shaped conductor 110 due to the molten liquid solder. Consequently, the soldering process may be performed stably and easily.

Further, during the SMT process of coupling the clip-shaped conductor 110 to the functional element 120, there is no need for a separate effort to align the clip-shaped conductor 110 such that a processing time may be shortened and a manufacturing cost may be reduced, thereby improving production efficiency.

Figure 5:
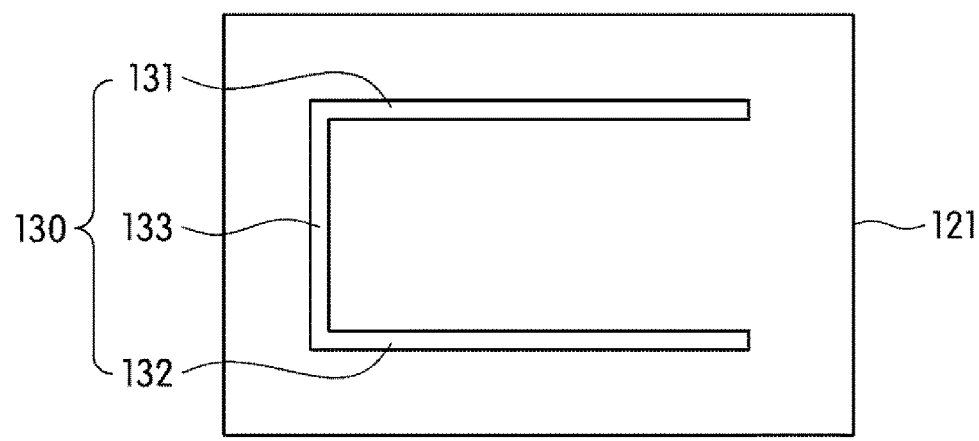
FIG. 5 is a plan view of a functional element of FIG. 1.

As shown in FIG. 5, the arrangement guide 130 may not be formed in a region in which the bent portion 112 having elasticity of the clip-shaped conductor 110 is disposed.

That is, since the bent portion 112 should be movable so as to provide the elasticity of the clip-shaped conductor 110, the bent portion 112 may not be confined by the arrangement guide 130 so that the arrangement guide 130 may be formed so as to surround only a part of the perimeter of the clip-shaped conductor 110 instead of surrounding an entirety of the perimeter thereof. For example, the arrangement guide 130 may be formed in a "⊏" shape.

Here, the arrangement guide 130 may include a first portion 131, a second portion 132, and a third portion 133.

The first portion 131 and the second portion 132 may be formed on both sides of the clip-shaped conductor 110 in a width direction, and the third portion 133 may vertically connect the first portion 131 to the second portion 132.

Thus, since the arrangement guide 130 is in contact with three sides of the perimeter of the clip-shaped conductor 110, the clip-shaped conductor 110 is aligned at a correct position by the arrangement guide 130, and the clip-shaped conductor 110 is confined by the arrangement guide 130 so as to not move due to the molten solder such that an alignment of the conductor 110 may be stably ensured.

However, the arrangement guide 130 is not limited to the above-described shape, and the arrangement guide 130 may be formed in various shapes capable of aligning a position of the clip-shaped conductor 110 and confining a part of the solder 101 in a molten state.

Figure 6:
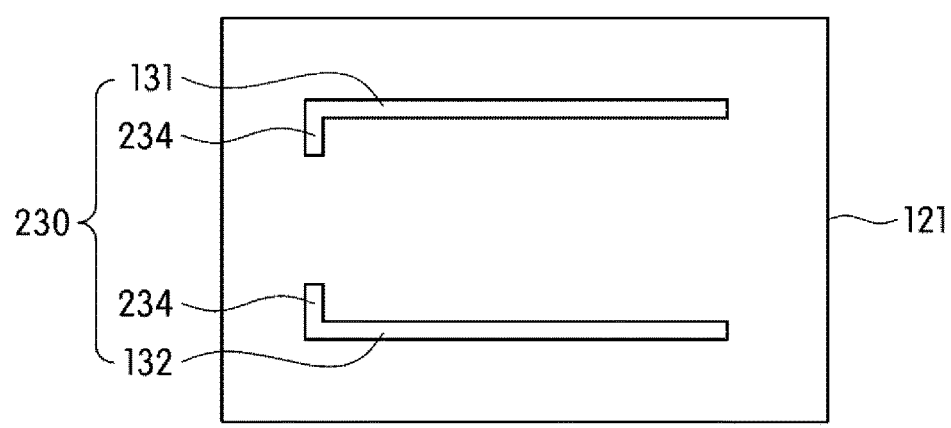
FIGS. 6 to 8 are plan views illustrating a modified example of an arrangement guide in a functional contactor according to one embodiment of the present invention.

As shown in FIG. 6, an arrangement guide 230 may include third portions 234 extending from one sides of the first portion 131 and the second portion 132 to be opposite to each other. That is, the arrangement guide 230 has a shape in which a part of intermediate portion of the third portion 133 connecting the first portion 131 to the second portion 132 in the arrangement guide 130 shown in FIG. 5 is cut.

As described above, since the clip-shaped conductor 110 may be confined without forming the arrangement guide 230 to connect between the first portion 131 and the second portion 132, a material for constituting the arrangement guide 230 may be reduced.

Figure 7:
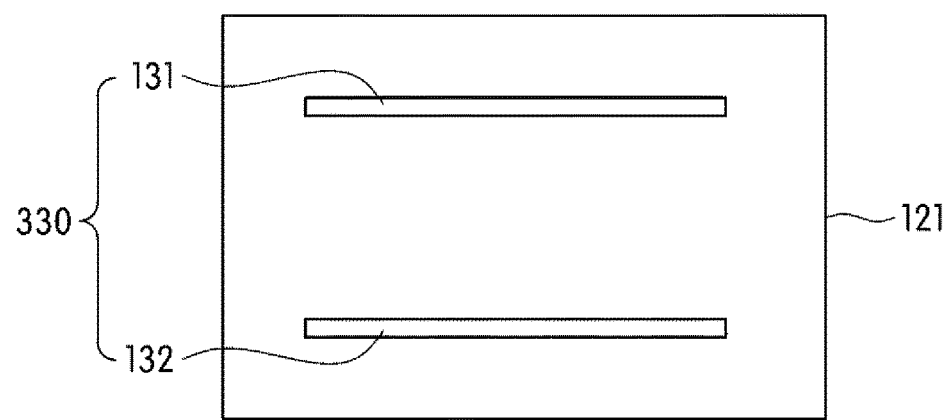

As shown in FIG. 7, an arrangement guide 330 may only be formed on two sides of the clip-shaped conductor 110 in a width direction. Here, the arrangement guide 330 may include the first portion 131 and the second portion 132 only.

As described above, even when the arrangement guide 330 is only provided on the two sides of the clip-shaped conductor 110 in the width direction and thus only a left-right misalignment of the clip-shaped conductor 110 is prevented, an alignment function may be provided so as to further reduce the material of the arrangement guide 130, thereby improving economic feasibility.

Figure 8:
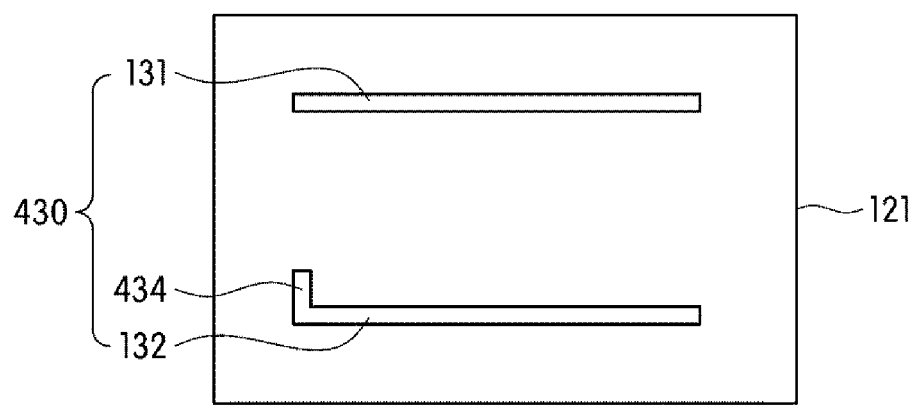

As shown in FIG. 8, an arrangement guide 430 may include a third portion 434 extending from the second portion 132. That is, the arrangement guide 430 has a shape in which the third portion 234 is only formed on the second portion 132 in the arrangement guide 230 of FIG. 6.

Here, although the third portion 434 has been shown and described as being formed on the second portion 132, the third portion 434 may be formed to extend from either the first portion 131 or the second portion 132.

As described above, even when the arrangement guide 430 is not formed so as to connect between the first portion 131 and the second portion 132, and the vertical extension 434 is only formed on a part of either the first portion 131 or the second portion 132, the clip-shaped conductor 110 may be confined such that a material constituting the arrangement guide may be further reduced as compared with the arrangement guide 230 of FIG. 6.

As described above, a pattern of the arrangement guides 130, 230, 330, or 430 may be determined in a suitable shape according to economic feasibility of the material and alignment precision of the clip-shaped conductor 110. That is, as shown in FIG. 5, when the position alignment of the clip-shaped conductor 110 is a more important factor, the arrangement guide 130 may be formed on three sides except for a perimeter of the bent portion 112 of the clip-shaped conductor 110, whereas, as shown in FIG. 7, when the economic feasibility is a more important factor, the arrangement guide 130 may be formed only on a part of the circumference of the clip-shaped conductor 110, which includes two sides of the clip-shaped conductor 110 in the width direction.

A process of soldering in the arrangement guide 130 will be described in more detail with reference to FIGS. 9 to 13.

Figure 9:
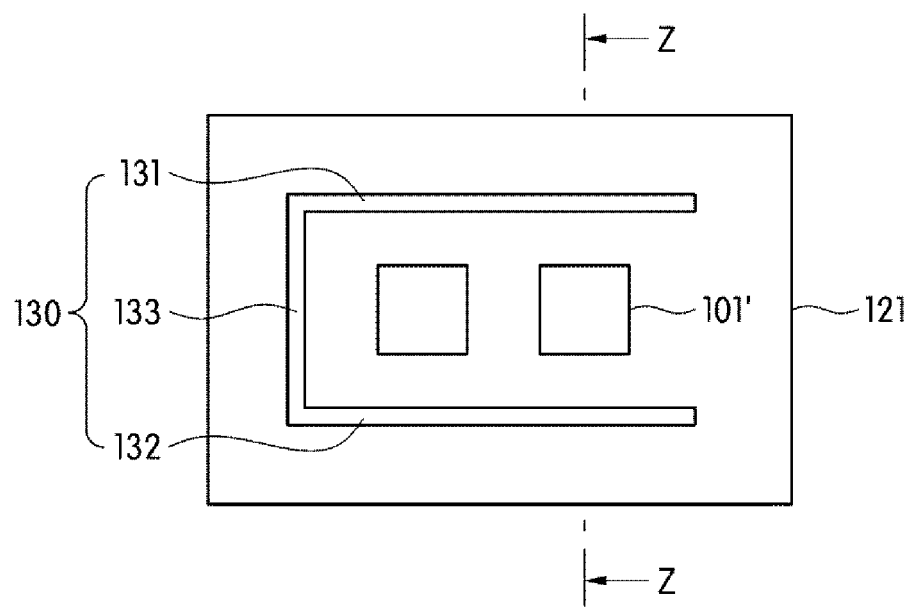
FIG. 9 is a plan view illustrating a state in which solder is printed on an upper surface of the functional element during a process of manufacturing the functional contactor according to one embodiment of the present invention.
Figure 10:
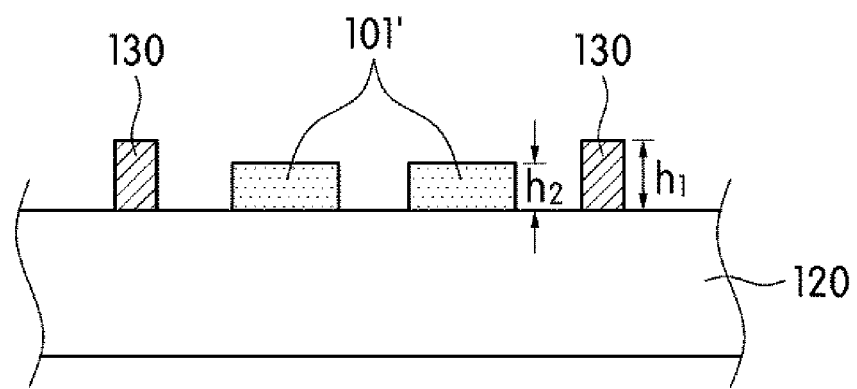
FIG. 10 is a cross-sectional view taken along line Z of FIG. 9.

As shown in FIGS. 9 and 10, the solder paste 101' is applied in a guide of a large-area first electrode 121 of the functional element 120 first. In this case, the solder paste 101' may be applied in at least a part of the arrangement guide 130 in a printing manner.

For example, a thickness of the arrangement guide 130 may be set such that the thickness h2 of the solder paste 101' is in a range of 60 to 100% of the thickness h1 of the arrangement guide 130 (see FIG. 10). That is, during reflow of the solder paste 101', the thickness h1 of the arrangement guide 130 may be formed to be larger than the thickness h2 of the solder paste 101' so as to prevent a molten liquid solder from passing over the arrangement guide 130.

Figure 11:
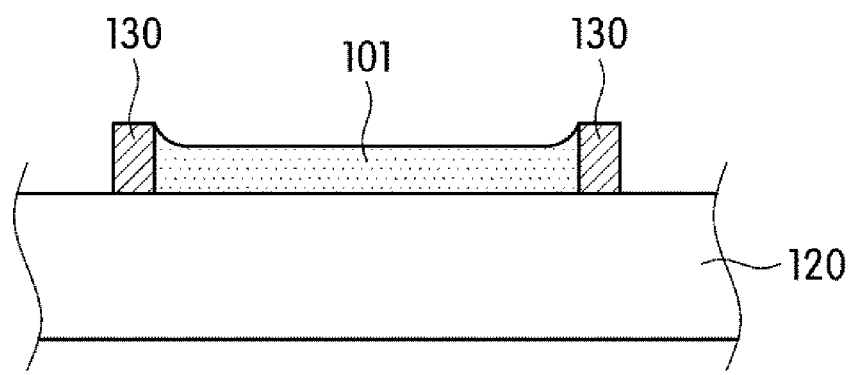
FIG. 11 is a cross-sectional view illustrating a state in which solder is melted on the upper surface of the functional element during the process of manufacturing the functional contactor according to one embodiment of the present invention.

As shown in FIG. 11, the solder paste 101' is reflowed by the SMT process to be in a state of the solder 101 being lower than the thickness of the arrangement guide 130. Thus, a misalignment or movement of the clip-shaped conductor 110 due to the molten liquid solder is prevented such that the clip-shaped conductor 110 may be stably aligned, and bondability of the clip-shaped conductor 110 to the functional element 120 may be improved.

Alternatively, the thickness of the arrangement guide 130 may be set such that the thickness h2 of the solder paste 101' becomes 1 to 10 times the thickness h3 of the arrangement guide 130' (see FIG. 12). That is, the thickness h3 of the arrangement guide 130 may be formed to be smaller than the thickness h2 of the solder paste 101' so as to minimize a usage amount of the arrangement guide 130'.

Figure 13:
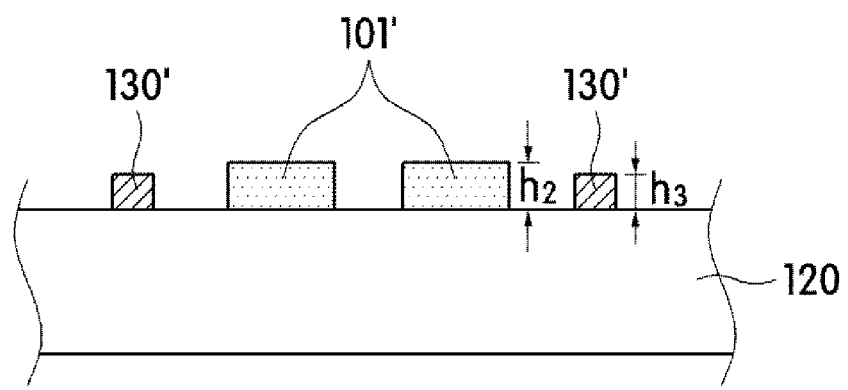
FIG. 13 is a plan view illustrating another example of a state in which solder is melted on the upper surface of the functional element during the process of manufacturing the functional contactor according to one embodiment of the present invention.

As shown in FIG. 13, the solder paste 101' is reflowed by the SMT process to be in a state of the solder 101 being higher than the thickness h3 of the arrangement guide 130'. Thus, a misalignment or movement of the clip-shaped conductor 110 is prevented due to surface tension of the molten liquid solder such that the clip-shaped conductor 110 may be stably aligned, and a usage amount of the arrangement guide 130 may be reduced while the bondability of the clip-shaped conductor 110 to the functional element 120 may be improved.

Here, preferably, the arrangement guide 130 or 130' may be formed to have a thickness in a range of 5 to 20 µm, the solder paste 101' may be formed to have a thickness in a range of 40 to 80 µm, and the solder 101 after the completion of soldering may be formed to have a thickness in a range of 20 to 40 µm.

Since the arrangement guide 130 is formed on the first electrode 121 made of a conductive material, the arrangement guide 130 may be made of a non-conductive resin. Consequently, it is possible to suppress a decrease phenomenon in insulation resistance or an increase phenomenon in leakage current, which occurs during an overglaze process.

In this case, the non-conductive resin may be formed of any one among overglass, epoxy, epoxy containing a filler, a polymer, and a non-conductive paste.

Further, since the non-conductive resin should serve as a guide for stable seating of the clip-shaped conductor 110 on a non-plated electrode or on a plated functional element 120, the non-conductive resin may be cured at a temperature that is lower than a melting temperature of the solder containing Sn as a main component. Here, when the non-conductive resin is made of a high temperature curing resin having a melting temperature that is higher than the melting temperature of the solder, a structure of the electrode or plating is changed such that soldering is not easy. For example, the non-conductive resin may be a low temperature curing resin which is cured at a temperature in a range of 140 to 210° C.

Further, the non-conductive resin may be thermally decomposed at a temperature that is higher than a melting point of the solder 101 so as to not be affected by the SMT process of forming the solder. That is, during the SMT process of coupling the clip-shaped conductor 110 to the functional element 120, even when the non-conductive resin is heated to the melting temperature of the solder paste 101' applied in the arrangement guide 130, the non-conductive resin may not be thermally decomposed and only the solder paste 101' may be melted.

Consequently, the non-conductive resin may be easily formed on the first electrode 121 of the functional element 120, and, even when the clip-shaped conductor 110 is soldered to the functional element 120 or the functional contactor 100 is soldered to the circuit substrate, the non-conductive resin may stably confine the clip-shaped conductor 110.

Although the exemplary embodiments of the present invention have been described, the spirit of the present invention is not limited to the exemplary embodiments disclosed herein, and it should be understood that numerous other embodiments can be devised by those skilled in the art that will fall within the same spirit and scope of the present invention through addition, modification, deletion, supplement, and the like of a component, and also these other embodiments will fall within the spirit and scope of the present invention.

The invention claimed is:

1. A functional contactor comprising:
   a clip-shaped conductor configured to come into electrical contact with a conductor of an electronic device and having elasticity;
   a functional element;
   a first electrode provided on an upper surface of the functional element, and a second electrode provided on a lower surface of the functional element, wherein the functional element is electrically connected in series to the clip-shaped conductor using a solder provided on a upper surface of the first electrode; and
   an arrangement guide formed to surround at least a part of the clip-shaped conductor on the upper surface of the first electrode so as to align a position of the clip-shaped conductor and made of a non-conductive resin,
   wherein the arrangement guide comprises a first portion and a second portion which are formed on two sides of the clip-shaped conductor in a width direction, and the first portion and the second portion are spaced apart from each other on the upper surface of the first electrode,
   wherein the first portion and the second portion extends along the width direction of the clip-shaped conductor, and
   wherein the first portion and the second portion confines the solder and the clip-shaped conductor which are located in the space between the first portion and the second portion on the upper surface of the first electrode, and the first portion and the second portion is configured to align the clip-shaped conductor when the solder is in a molten state.

2. The functional contactor of claim 1, wherein the arrangement guide is not formed in a region in which a bent portion having elasticity of the clip-shaped conductor is disposed.

3. The functional contactor of claim 1, wherein the arrangement guide is formed to have a thickness corresponding to 10 to 170% of a printed thickness of the solder.

4. The functional contactor of claim 1, wherein the arrangement guide is formed to be spaced a predetermined gap apart from the clip-shaped conductor.

5. The functional contactor of claim 1, wherein the arrangement guide is formed to be in contact with the clip-shaped conductor.

6. The functional contactor of claim 1, wherein the arrangement guide further includes a third portion extending from at least one of the first portion and the second portion in a direction toward the remaining one thereof.

7. The functional contactor of claim 1, wherein the arrangement guide further includes a third portion vertically connecting the first portion to the second portion.

8. The functional contactor of claim 1, wherein the non-conductive resin is formed of one among overglass, epoxy, epoxy containing a filler, a polymer, and a non-conductive paste.

9. The functional contactor of claim 1, wherein the non-conductive resin is made of a low temperature curing resin which is cured at a temperature in a range of 140 to 210° C.

10. The functional contactor of claim 1, wherein the non-conductive resin is thermally decomposed at a temperature that is higher than a melting point of the solder.

11. The functional contactor of claim 1, wherein the functional element has at least one among an electric shock prevention function of blocking a leakage current of an external power source flowing from a ground of a circuit substrate of the electronic device, a communication signal transfer function of passing a communication signal flowed from a conductive case or the circuit substrate, and an electrostatic discharge (ESD) protection function of passing the ESD without a dielectric breakdown when the ESD flows from the conductive case.

12. The functional contactor of claim 1, wherein the non-conductive resin is cured at a temperature that is lower than a melting point of the solder, and is thermally decomposed at a temperature that is higher than the melting point of the solder.

\* \* \* \* \*